United States Patent [19]

Platter et al.

[11] 4,396,458

[45] Aug. 2, 1983

[54] METHOD FOR FORMING PLANAR METAL/INSULATOR STRUCTURES

[75] Inventors: Valeria Platter, Poughkeepsie, N.Y.; Laura B. Rothman, South Kent, Conn.; Paul M. Schaible; Geraldine C. Schwartz, both of Poughkeepsie, N.Y.

[73] Assignee: International Business Machines Corporation, Armonk, N.Y.

[21] Appl. No.: 333,196

[22] Filed: Dec. 21, 1981

[51] Int. Cl.$^3$ .................... H01L 21/306; B44C 1/22; C03C 15/00; C03C 25/06

[52] U.S. Cl. .................... 156/643; 156/646; 156/652; 156/653; 156/656; 156/664; 156/665; 156/667; 427/86; 427/89; 427/90; 427/126.3; 427/307; 427/404; 427/405; 427/419.2; 430/314; 430/316; 430/318; 430/323; 430/324

[58] Field of Search .............. 156/652, 653, 655, 657, 156/656, 659.1, 664, 665, 667, 643, 646; 430/314, 318, 316, 323, 324; 427/86, 89–91, 126.3, 259, 282, 287, 307, 327, 328, 404, 405, 419.2

[56] References Cited

U.S. PATENT DOCUMENTS

| | | | |
|---|---|---|---|
| 3,442,012 | 5/1969 | Murray | 427/82 |
| 3,657,029 | 4/1972 | Fuller | 156/656 |
| 3,661,761 | 5/1972 | Koenig | 204/192 R |
| 3,804,738 | 4/1974 | Lechaton et al. | 24/205.13 R |
| 3,868,723 | 2/1975 | Lechaton et al. | 204/192 |
| 3,873,361 | 5/1975 | Franco et al. | 204/192 |
| 3,976,524 | 8/1976 | Feng | 427/335 |
| 3,985,597 | 10/1976 | Zielinski | 427/90 |
| 4,035,276 | 7/1977 | Havas et al. | 156/656 |
| 4,090,006 | 5/1978 | Havas et al. | 156/659.1 |
| 4,132,586 | 1/1979 | Schaible | 156/659.1 |
| 4,272,561 | 6/1981 | Rothman et al. | 156/650 |

OTHER PUBLICATIONS

T. Serikawa et al., "Lift-Off Patterning of Sputtered SiO$_2$ Films", J. Electrochem. Soc., v. 8, N. 4, Apr. 1981, pp. 918–919.

J. P. Reekstin et al., "Fabrication of Large Bubble Circuits", IEEE Trans. on Magnetics, v. Mag-9, N. 3, Sep. 1973, pp. 485–488.

N. Tsuzuki et al., "256 kbt Bubble Memory Chip Fabrication and Characterization", J. Appl. Phys. 50 (3) Mar. 1979, pp. 2219, 1931 and 1932.

IBM Technical Disclosure Bulletin, "Multilevel Wiring for Integrated Circuits", O. Bilous et al., vol. 13, No. 2, pp. 429–430, Jul. 1970.

Primary Examiner—Edward C. Kimlin
Assistant Examiner—Timothy W. Heitbrink
Attorney, Agent, or Firm—Henry Powers

[57] ABSTRACT

Formation of planar conductor/insulator semiconductor devices utilizing hafnium coated aluminum based metallization with a magnesium oxide mask for dry etching of the metallization and deposition of planar insulation.

The hafnium coating is used to protect the aluminum metallization during mask removal, and as a registration enhancer for subsequent electron-beam processing.

32 Claims, 31 Drawing Figures

METHOD FOR FORMING PLANAR METAL/INSULATOR STRUCTURES

DESCRIPTION

TECHNICAL FIELD

This invention relates to the fabrication of semiconductor components, and more particularly to the formation of coplanar conductor/insulator films on components such as integrated circuits or dielectric substrates employed in the fabrication and packaging of semiconductor components.

One object of the present invention is to provide an improved and new process for forming planar insulator/metal structures.

Another object of the present invention is to provide a new and improved process for the fabrication of semiconductor devices having an interconnection metallurgy or conductor pattern embedded in an insulating layer with planar top surfaces.

Another object of the present invention is to provide a new and improved method for forming one or more planar insulator/conductor films on a substrate.

Another object of this invention is to provide a new and improved process for deposition of an insulator and to embed raised conductor pattern, relative to a supporting substrate, whereby the surface of the insulator is in planar extension.

BACKGROUND ART

Lift-off techniques are finding increased interest and use in the fabrication of integrated circuits to achieve greater component density particularly in large scale integrated circuitry. Typical of the lift-off techniques are those described in U.S. Pat. Nos. 2,559,389, 3,849,136, 3,873,361 and 3,985,597.

One of the patents of particular interest is U.S. Pat. No. 3,985,597 which describes a process for forming an embedded interconnection system on a substrate by forming a first layer of an organic thermosetting polymerized resin layer (such as a polyimide) over the substrate; forming a second overlying layer of a material (such as a polysulfone) that is soluble in a solvent specific to it without appreciably affecting the material of the first layer (e.g. polyimide); forming a third thin barrier layer (e.g. $SiO_x$, glass resin, etc.) resistive to ion etching in $O_2$ on the second layer; depositing a resist layer; exposing the resist in a pattern of the desired metallurgy pattern; developing the resist to form a mask of the desired metallurgy pattern; reactive ion etching the resultant exposed areas of the first, second, and third layers; blanket depositing a conductive metal layer having a thickness approximately matching the thickness of the first layer (e.g. poyimide); and exposing the substrate to a solvent that is selective to the material of the second layer (e.g. polysulfone), which is removed together with the overlying portions of the barrier and metal layers.

In contrast to the above U.S. Pat. No. 3,985,597, which forms a conductive metal pattern within corresponding recessed openings or grooves of an insulating layer (e.g. polyimide), a particularly unique modification of the process is that of U.S. Pat. Nos. 4,035,276 and 4,090,006 in which an insulating layer (e.g. silicon dioxide, glass, etc) is deposited to embed a preformed conductor pattern coated by a release layer, where the release layer coated conductor pattern is formed by lift-off techniques. The release layer (e.g. copper, chrome, etc.) and the overlying insulator layer are subsequently removed by exposure to an etchant such as concentrated nitric acid.

Although an effective process is described therein, it is desireable to obtain a simpler process with further reduced deviation from planarity. For example, in the application of this process to aluminum based metallurgy (e.g. aluminum, aluminum/copper, and other alloys thereof), improved enhancement of registration is desireable for the next E-beam exposure processing, since it is difficult to distinguish adequately between aluminum based metallization and silicon dioxide or glass insulators which only have about a 1000A step between them. Also, it is desireable to protect the aluminum based metallization during etching of the release layer, and thus avoid pitting of the conductor pattern. These objectives become more significant in view of the substantial increases in densities of semiconductor devices, particularly with increasing levels of metallization. Such higher densities of the devices render them sensitive to fabrication tolerances. For example, four levels of metallization are becoming common in integrated circuit designs. Even with three levels of metallization, the integrated circuits become wire limited as the density of the device increases. A simpler and improved planar process is also necessary in order to maintain and insure good coverage of metal and insulators at all levels.

BRIEF DESCRIPTION OF THE DRAWINGS

In the accompanying drawings forming a material part of this disclosure.

DISCLOSURE OF THE INVENTION

Figure 1A:
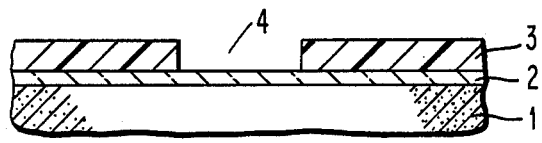
FIGS. 1A to 1G are diagrammatic cross-sectional views illustrating a substrate at various stages of fabrication in accordance with one embodiment of the concept of the invention described herein.

It has been found in accordance with this invention that protectively coating a conductor pattern, on a dielectric substrate, with a film of hafnium, in conjunction with a dry etch mask of MgO as described in U.S. Pat. No. 4,132,586, simplifies the fabrication process for planar insulator/conductor structure with enhanced protection of the conductor pattern, and which also enables enhanced registration capabilities for any following E-beam processing.

As shown in the embodiment of FIGS. 2A to 2I for example, for purposes of fabricating semiconductor devices, a blanket layer of a conductive metal (e.g. an aluminum based metal, such as aluminum, aluminum-copper alloy, etc.) is deposited, as by evaporation or sputtering, over an integrated circuit structure, including any insulating layers thereon, such as silicon dioxide, Si$_3$N$_4$, or composites thereof, glass, and the like. This is followed by blanket deposition of a film of hafnium, by any conventional manner (e.g. evaporation or sputtering) over the aluminum layer.

A lift-off mask is then formed over the hafnium layer defining a pattern of openings corresponding to the desired conductor pattern. This lift-off mask can be formed by well known techniques which can be found described in the above noted patents, as well as in U.S. Pat. Nos. 3,421,206, 3,934,057, 3,982,943 and 4,004,044.

Illustratively, in accordance with these lift-off techniques, a polysulfone lift-off layer can be applied by spin-coating, which is then cured on a hotplate. A barrier layer of SiO$_x$ (or glass resin) is then deposited by evaporation, spinning or PECVD (plasma enhanced chemical vapor deposition), as appropriate, over the lift-off layer. This is followed by coating the structure with an appropriate resist followed by exposure and development using standard photo or electronbeam lithographic techniques to form a pattern of openings corresponding to the desired conductor pattern.

Using the patterned resist as a masking layer, conformal openings can be suitably formed in the barrier layer, as for example by RIE utilizing any suitable ambient, which for a silicon monoxide barrier layer can comprise a carbon tetrafluoride (CF$_4$) ambient.

This is normally followed by suitable etching of conformal openings in the polymer (e.g. polysulfone) subbase of the lift-off structure, as for example, again by RIE in the same sputtering chamber in which, for a polysulfone base, the ambient can be switched, with purging, to an oxygen containing atmosphere to which silicon monoxide is comparatively resistant. As will be appreciated, the provision of the indicated conformal openings in the lift-off mask exposes a corresponding pattern of the composite hafnium/aluminum films. The resist here is removed coincidently by the O$_2$-RIE etching of the "polysulfone layer".

A blanket layer of magnesium oxide (MgO) is then deposited, as by evaporation, over the lift-off mask and the exposed portions of the compositely layered metallization, followed by removal of the lift-off mask by solvation of the lift-off polymer in a suitable solvent, such as n-methyl pyrrolidinone (NMP) at 60° C. for polysulfone. On removal of the lift-off mask with its overlying barrier layer and magnesium oxide layer, a dry etch mask of magnesium oxide is retained to expose complementary portions of the hafnium/aluminum composite metallization. Further details of the formation of the MgO dry etch mask can be obtained by reference to U.S. Pat. No. 4,132,586.

The MgO masked structure is then subjected to dry etching processes for removal of the exposed portion of the hafnium/aluminum composite. For example, for a hafnium coated aluminum-copper alloy composite the dry etching can be effected by RIE at 0.4 watts per cm$^2$ at 13.56 MHz in a CCl$_4$/argon plasma in accordance with the system described in U.S. Pat. No. 3,994,793.

In the operation, an insulator (such as glass, SiO$_2$, etc.) is blanket deposited by rf sputtering, to cover the exposed substrate, and the MgO mask. Normally, the insulator will be deposited to a level matching the thickness of the composite metal conductor pattern. The insulator may be sputter deposited under conditions which cause considerable resputtering at the substrate. This causes the sidewalls of the MgO mask to be substantially free of deposited insulator after completion of the insulator deposition. Alternately, the insulator may be sputter deposited under conditions which effect lower resputtering at the substrate. Any insulator deposited on the sidewalls of the MgO mask may then be removed by increasing the resputtering at the substrate. The resputtering can be adjusted so that only the excess insulator on the sidewalls of the MgO is removed without appreciably changing the thickness of the insulator deposited to cover the exposed substrate. Another method of deposition of the insulator is to blanket sputter deposit the insulator to a level in excess of the thickness of the composite metal conductor pattern and then to remove the excess insulator by rf sputter etching. The etch-back step causes the sidewalls of the MgO mask to be free of deposited insulator.

The basic processing concept is completed by removal of the MgO mask, and the overlying portions, by exposure to a suitable solvent such as solution of oxalic acid, ammonia oxalate, acetic acid, phosphoric acid/chromic acid, and the like.

Although the above describes the formation of a single level of a coplanar conductor/insulator pattern, the invention is also comprehended for use in forming multi-level structures. In particular, the invention is also intended for the formation of via studs, interconnections, or feedthroughs between metallization levels using the same basic step.

Also, although the invention described above has been with respect to its application for forming semiconductor devices, the invention is equally applicable to the formation of metallization patterns on a dielectric module (e.g. ceramics, as alumina, glass, glass-ceramics, etc.) such as described in U.S. Pat. Nos. 3,726,002, 3,968,193, 4,221,047 and 4,234,367, which are employed for supporting integrated circuit chips or devices and appropriate associated circuitry.

However applied, the critical parts of the invention reside in the described use of hafnium and magnesium oxide in view of their coordinated unique functions.

The MgO layer forms a suitable lift-off layer for SiO$_2$ deposition because it withstands the relatively high temperatures of SiO$_2$ sputter deposition. Also, it likewise has a very low erosion rate for reactive ion etching in CCl$_4$, and therefore can serve as an RIE mask to form the metal patterns.

Hafnium serves as a protective layer for the metallization (e.g. aluminum/copper alloy) during the etch of the MgO lift-off mask in etchants (e.g. phosphoric acid/chromic acid mix). For example, above 40° C. the phosphoric/chromic acid etch attacks aluminum/copper alloys and causes pitting of the metal. However, with a protective layer of hafnium, etching of the MgO mask in the phosphoric/chromic etch at 80° C. can be accomplished without attack of the aluminum/copper alloy. As a result, this allows the MgO lift-off to proceed at a much faster rate than if the etch temperature were limited to less than 40° C. A typical rate employing the protective hafnium coating at 80° C. enables the lift-off of a 10 mil wide MgO pattern in 10 minutes.

Also the use of the hafnium was found to be a registration enhancer for subsequent E-beam exposure processes. The presence of the hafnium over, for example, aluminum/copper alloys enables E-beam exposure units to register to the metal pattern. Without Hf, it is very difficult to adequately distinguish between the metal and insulator (e.g. SiO$_2$) because there is only about a 1000Å step between the two.

BEST MODES FOR CARRYING OUT THE INVENTION

Referring to the drawings, and to FIGS. 1A to 1G in particular, there is shown a substrate 1 which is typically monocrystalline silicon or other semiconductor material, with an overlying layer 2 of a dielectric coating, as for example $SiO_2$, $Si_3N_4$, or composites thereof, and the like. The substrate 1 in this embodiment of the invention is comprehended as an integrated circuit device having active and passive devices fabricated therein (not shown) and means for electrically isolating the devices from each other. In such application, the insulating layer 2 is normally provided with contact openings (not shown) for making contact to the active and passive devices. However, the substrate can also be a body of insulating material when the process is used to form metallurgy patterns on a dielectric module (e.g. alumina ceramics, glass-ceramics, etc.) for supporting integrated circuit chips or devices, and appropriate associated circuitry.

Next a layer 3 of lift-off masking material is coated over the insulating layer 2. This masking material is characterized as an organic polymer material, such as described in the above noted patents, or standard photo or electron beam resists which can be applied in any conventional manner, as by spin coating. Where resists are employed, they can be processed into a lift-off mask with a pattern of openings 4 by exposure and development in accordance with conventional lithographic techniques well known in the integrated circuit fabrication art.

Where the desired metallization of the following step is to be a first level conductive pattern, the opening pattern 4, of the mask, will include extensions in registration with the contact openings to active devices of an integrated circuit substrate through the insulator layer 2.

As indicated, other polymeric materials can be employed in forming the lift-off mask 3. For example, these materials can comprise polysulfones, polycarbonates, heat-stabilized Shipley AZ-1350J resist (a cresol formaldehyde containing an o-quinonediazide sensitizer) etc. which can be suitably deposited for layer 3. It is only necessary that the material chosen be such that it is soluble in a solvent selective to it. One effective material is a polysulfone polymerized resin formed by reacting sulfur dioxide with aromatic or alphatic vinyl compounds. A typical polysulfone is sold under the trademark ICI 100-P by Imperial Chemical Inc. The polysulfone is available as a relatively viscous liquid which can be deposited on a substrate, e.g. semiconductor wafer, and then spun in the range of 4000 rpm. Preferably, the polysulfone material, which is in a solution of n-methyl pyrrolidinone, is deposited and spun in a low humidity air or in $N_2$ atmosphere. The material is subsequently cured by heating for five minutes at 80° C. and for 20 minutes at 300° C. A relatively thin barrier film (not shown) is normally deposited over the polysulfone material where the structure is to be subjected to reactive ion etching in $O_2$ (as in other embodiments of this invention). This barrier film can be a layer of $SiO_2$, $SiO_x$, $Al_2O_3$, Si, $Si_xN_yH_z$, glass resin or a metal layer, as in U.S. Pat. Nos. 4,035,276 and 4,090,006. A typical material for the barrier layer is $SiO_x$ deposited by evaporation or plamsa enhanced chemical vapor deposition (PECVD). However, any suitable type of glass or inorganic material that is resistant to reactive ion etching, particularly in an ambient of $O_2$ or an ambient that contains $O_2$, can be used. A layer of a photo or an E-beam resist is then deposited over the structure, exposed in the desired conductor pattern, and developed in accordance with known lithographic technology. One preferred method of forming conformal openings in the lift-off mask, through the resist mask, is by reactive ion etching, where the substrate is exposed to a reactive ion plasma generated in an appropriate ambient by an rf source in a sputter apparatus such as described in U.S. Pat. No. 3,498,710. In removing the material, in the case where it is a $SiO_x$, the ambient at least includes $CF_4$. Subsequently, the ambient in the sputter apparatus is changed to an $O_2$ ambient and the exposed portions of sub-layer of the lift-off mask structure, e.g. polysulfone, is removed. For purpose of this application such a composite $SiO_x$/polysulfone lift-off mask is comprehended as equivalent to the resist mask 3 of the drawings, with the term "lift-off mask" in turn comprehending all equivalent lift-off mask structures.

Figure 1B:
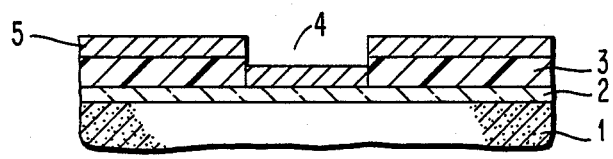
Figure 1C:
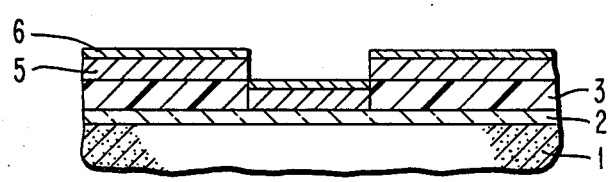
Figure 1D:
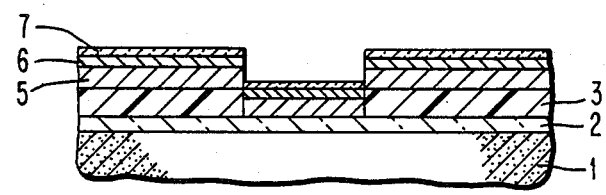

Next, as shown in FIG. 1B, a layer 5 of a functional conductive metal (e.g. aluminum, aluminum-copper alloys, and the like) is blanket deposited, as by evaporation or sputtering over the surface of the structure, resulting in a metal layer on top of the lift-off mask and on the portions of the substrate exposed by the openings 4 in the lift-off mask 3. As shown in FIG. 1C, a layer 6 of hafnium is blanket deposited over the structure, which encompasses the metallization 5 on lift-off mask 3 and in the openings thereof, followed by blanket deposition of magnesium oxide layer 7 over the structure as shown in FIG. 1D.

Figure 1E:
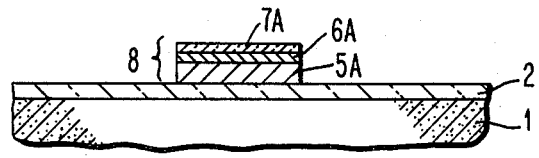

In the next operation, as shown in FIG. 1E, the lift-off mask and all overlying layers are then removed by exposing the substrate to a solvent specific for the lift-off mask. In the case of polysulfones, the solvent is n-methyl pyrrolidinone at 60° C. enhanced by ultrasonic agitation. As shown the resultant structure forms a composite pattern 8 of deposited segments 5A, 6A and 7A.

Figure 1F:
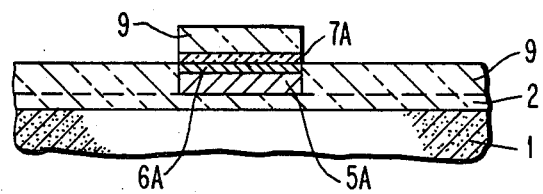

With the composite pattern 8 in place, an insulator 9 is deposited in blanket fashion over the structure as shown in FIG. 1F to a thickness substantially that of the composite hafnium/metal segments 5A and 6A. In the preferred form, the insulator can be $SiO_2$, glass and the like, which can be deposited by rf sputtering. The rf sputter deposition of the insulator may be made under conditions which cause considerable resputtering at the substrate. This causes the sidewalls of the MgO mask to be substantially free of deposited insulator after completion of the insulator deposition. Alternately, the insulator may be sputter deposited under conditions which effect lower resputtering at the substrate. Any insulator deposited on the sidewalls of the MgO mask may then be removed by increasing the resputtering at the substrate. The resputtering can be adjusted so that only the excess insulator on the sidewalls of the MgO is removed without appreciably changing the thickness of the insulator deposited to cover the exposed substrate. Another method of deposition of the insulator is to blanket sputter deposit the insulator to a level in excess of the thickness of the composite metal conductor pattern and then to remove the excess insulator by rf sputter etching. The etch-back step causes the sidewalls of the MgO mask to be free of deposited insulator.

Figure 1G:
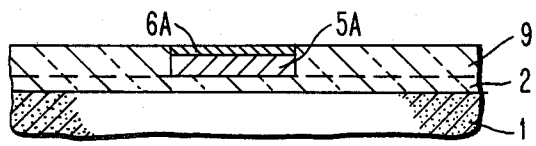

In the next operation, the magnesium oxide segment 7A of composite pattern 8 together with the overlying insulator, is removed or lifted off in a suitable solvent or etchant, as for example, a phosphoric/chromic acid mix among those noted above. The resultant structure is shown in FIG. 1G which may illustratively comprise a first level conductive pattern of a multi-level metallization.

Figure 2A:
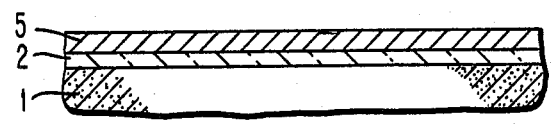
FIGS. 2A to 2I show a sequence of elevational view, in broken section, illustrating a substrate at various stages of fabrication in accordance with another embodiment of the concept of the invention described herein.
Figure 2B:
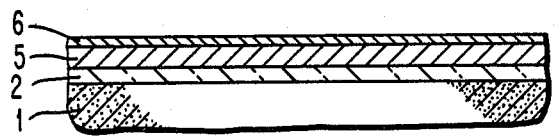
Figure 2C:
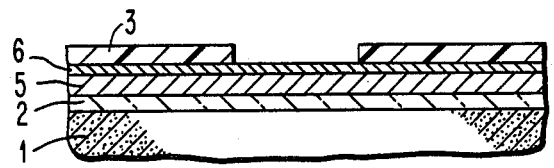
Figure 2D:
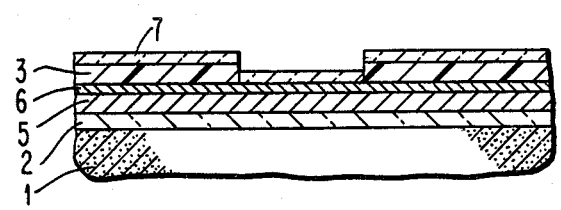
Figure 2E:
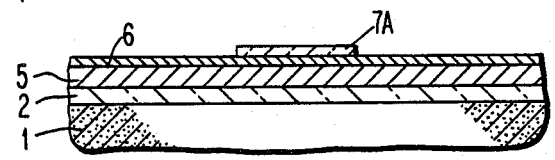
Figure 2F:
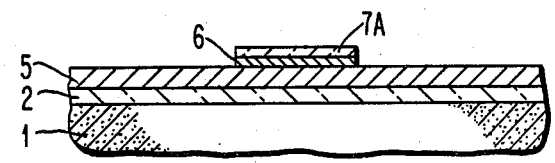
Figure 2G:
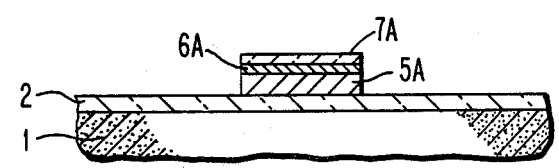
Figure 2H:
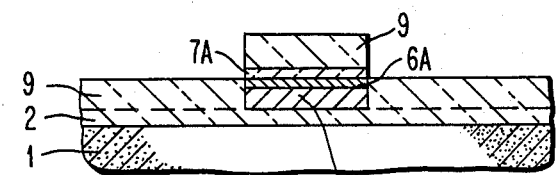

FIGS. 2A to 2I representative of modification of the concept of the invention to another embodiment. As above, the structure illustrated is shown with a coating of an insulator 2, e.g. $SiO_2$, over a substrate 1, such as a semiconductor device or a ceramic substrate. The insulation 2 is then coated sequentially with a metallization layer 5 (FIG. 2A, e.g. aluminum-copper alloy), and a hafnium layer 6 (FIG. 2B). In the next step a lift-off mask 3 is formed over the composite metallization 5 and 6, followed by blanket deposition of a magnesium oxide layer 7. After removal of the lift-off mask 3, together with the overlying MgO portions, the resultant structure is shown in FIG. 2E where the retained MgO segment 7A forms a dry etch mask comparable to that described in U.S. Pat. No. 4,132,586.

The magnesium oxide masked structure is then subjected to dry etching for removal of the exposed portions of the composite hafnium/conductor films 6/5 down to the insulator 2. For example, with the exposed composite metal films 6/5 comprised of hafnium and aluminum-copper alloy, it can be dry etched by reactive ion etching through the hafnium and the aluminum-cooper alloy in a $CCl_4$/argon ambient, in the manner sequentially shown in FIGS. 2E and 2F to that of FIG. 2G.

Figure 2I:
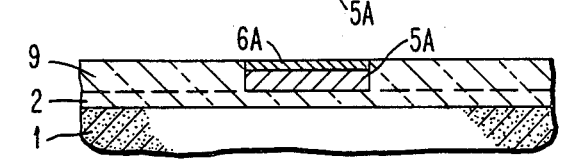

An insulator 9, such as $SiO_2$ or glass for example, is then blanket deposited as above, over the structure, followed by lift-off removal of the MgO segment 7A and the overlying segment of the insulator by use of suitable solvents. The resultant structure shown in FIG. 2I is equivalent to that of FIG. 1G, each characterized with a coplanar insulator/conductor surface.

Figure 3A:
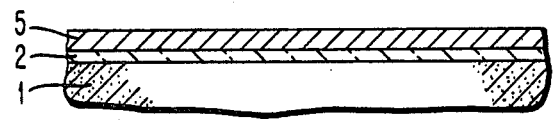
FIGS. 3A to 3H also show a sequence of elevational views, in cross-section, illustrating the fabrication of structure in accordance with a further embodiment of the concept of the invention described herein.
Figure 3B:
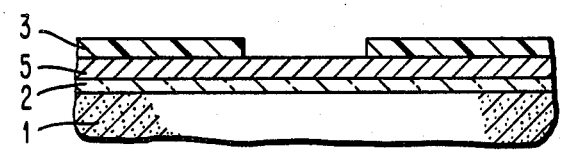
Figure 3C:
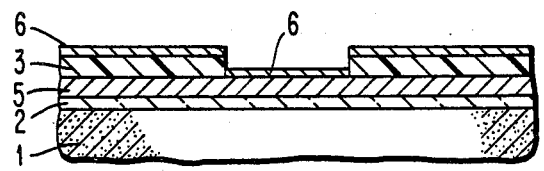
Figure 3D:
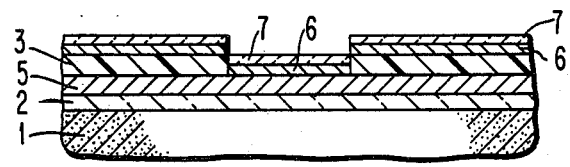
Figure 3E:
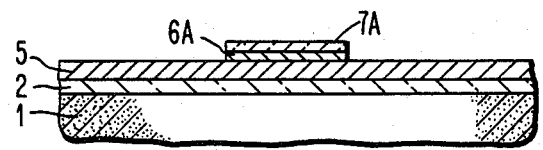
Figure 3F:
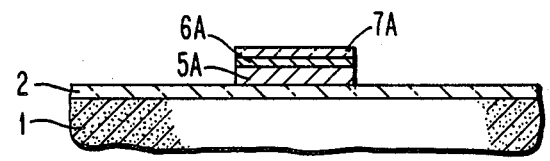
Figure 3G:
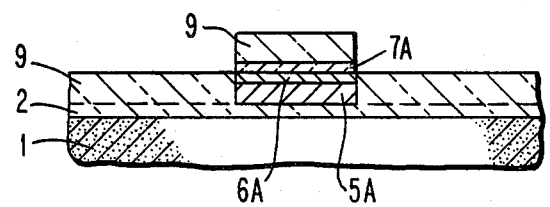
Figure 3H:
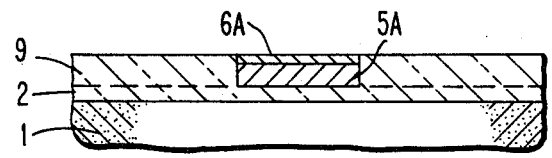

FIGS. 3A to 3H illustrate a variation of the preceding embodiment in which a lift-off mask 3 is formed on an aluminum film, followed by blanket depositions of a hafnium layer 6 and a MgO layer 7, which on removal of the lift-off mask 3 form a dry etch mask of MgO and Hf segments 7A and 6A. On reactive ion etching of the exposed portions of the metallization 5, the resultant structure shown in FIG. 3F is comparable to that of FIG. 2G, with subsequent processing being the same as that through FIGS. 2G to 2I to produce the resultant structure of FIG. 3H which is equivalent to that of FIGS. 1G and 2I.

Figure 4A:
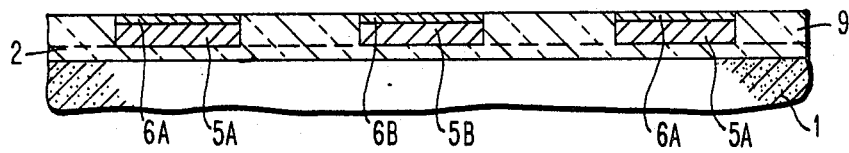
FIGS. 4A to 4G are schematic cross-sectional views illustrating the fabrication of multilevel metallization from preformed first level insulator/metallization obtained by the processing of FIGS. 1A to 1G, 2A to 2I and 3A to 3H, utilizing the concept of the invention described herein.
Figure 4B:
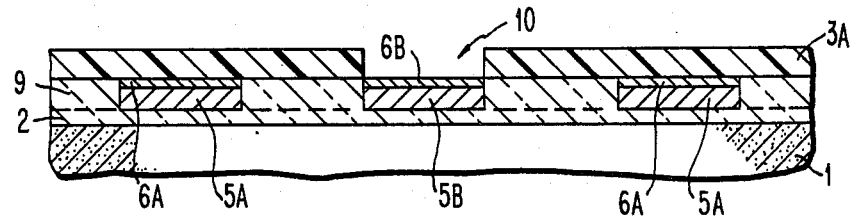

Although the process has been discussed with reference to formation of a single level of coplanar insulator/conductor structures, it is also effective in forming multi-level structures. Specifically, the formation of via studs or interconnecting feed-throughs between spaced levels of metallization is also comprehended. The formation of a typical interconnecting stud is shown in FIGS. 4A to 4F. Shown in FIG. 4A is substrate 1 with a single level conductor formed in accordance with this invention to correspond to those of FIGS. 1G, 2I and 3H. As above, the formation of vertical interconnecting stud employs the use of a lift-off mask 3A illustratively formed with an opening 10 over a selected segment 5B/6B of the first level conductor pattern 5A/6A.

Figure 4C:
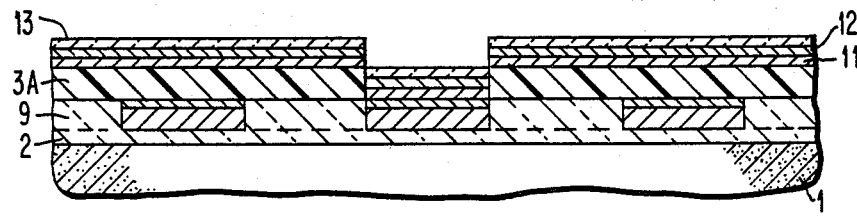
Figure 4D:
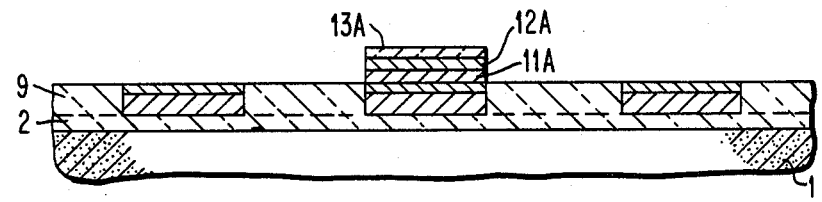

In FIG. 4C, a functional conductive metal layer 11 overcoated with a hafnium layer 12 is blanket coated over the substrate, as discussed above. This is followed with a blanket overcoating of a magnesium oxide layer 13, followed by removal of the lift-off mask 3A leaving a mesa or stud of the functional metal segment 11A and the hafnium segment 12A, and the MgO segment or cap 13A as shown in FIG. 4D. Again, aluminum based metals, including aluminum and aluminum-copper alloy are illustratively comprehended in view of their highly reactive properties.

An insulator layer 14 (as of $SiO_2$, glass, etc.) is then blanket deposited over the substrate, inclusive of the MgO cap 13A to a thickness substantially that of the combined thickness of the functional metal/hafnium segments 11A/12A.

Figure 4E:
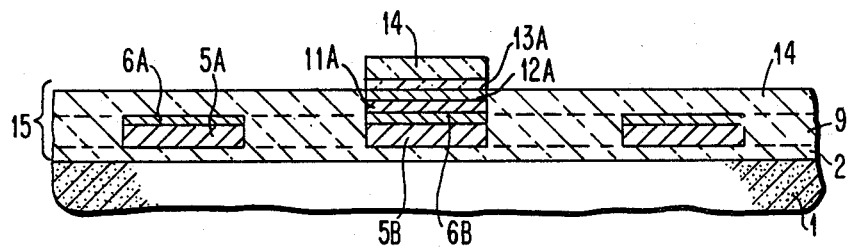
Figure 4F:
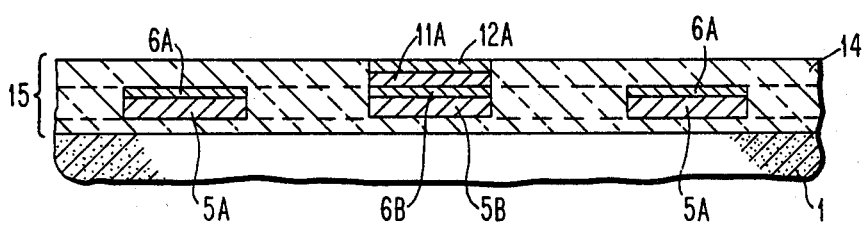

As shown in FIG. 4F, the process for forming the interconnecting feedthrough stud is completed by lifting off the MgO cap 13A together with the overlying portion of the insulating layer 14 in a suitable etchant as described above. As will be appreciated where the same insulator, e.g. $SiO_2$, is employed in all stages of fabrication, the original insulation 2, and deposited layers 9 and 14 will be integrated into a unitized insulator composite 15 (as shown in FIGS. 4E and 4F).

Figure 4G:
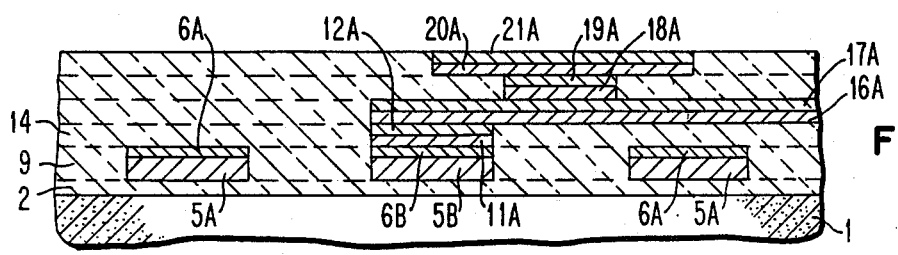

FIG. 4G illustrates a five level conductor structure formed atop a substrate using the same process steps to achieve the three levels of metallization as well as the interconnecting studs between levels. Thus, the metallization composites, of the functional metal and hafnium components 5A/6A, 16A/17A and 20A/21A are the conductive patterns formed in three levels with adjacent levels interconnected respectively with interconnecting studs formed of functional metal/hafnium components 11A/12A and 18A/19A.

Thus, as will be apparent to those skilled in the art, any desired number of interconnected layers can be formed by repeating the steps of the various embodiments described above, including intermixing of the basic steps of the embodiments at various metallization and stud levels.

While the invention has been illustrated and described with reference to preferred embodiments of the invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. A method for the formation of a planar dielectric coating over a surface of a substrate having a conductive pattern of an aluminum based metal thereon exposing complementary portions of said substrate, comprising:

forming a hafnium coating over a portion of said pattern, forming a magnesium oxide coating on said hafnium coating, depositing a dielectric coating over said substrate inclusive of said magnesium oxide coating, and wet etching said magnesium oxide coating for removal thereof together with the overlying portions of said dielectric coating thereon.

2. The method of claim 1 wherein said substrate surface comprises a passivating coating on a semiconductor device having at least one integrated circuit therein.

3. The method of claim 2 wherein said coating has at least one via opening for interconnection of an element of said device to said pattern.

4. The method of claim 1 wherein said substrate comprises a ceramic.

5. The method of claim 1 wherein said substrate is a glass ceramic.

6. A method for formation of a planar dielectric coating over a surface of a substrate comprising:
   (A) forming on said surface a lift-off mask having a pattern of openings exposing complementary portions of said surface to define a desired metallization pattern,
   (B) sequentially depositing over said surface inclusive of said mask films of an aluminum based metal, hafnium and magnesium oxide,
   (C) removing said mask with the overlying layers of said sequential films thereon,
   (D) sputter depositing a layer of a dielectric over said substrate, and
   (E) selectively wet etching said substrate to remove remaining portions of said magnesium oxide film and overlying portions of the dielectric layer thereon.

7. The method of claim 6 wherein said substrate surface comprises a coating on a semiconductor device having at least one integrated circuit therein.

8. The method of claim 7 wherein said coating has at least one via opening for interconnection of an element of said device to said pattern.

9. The method of claim 6 wherein said substrate comprises a ceramic.

10. The method of claim 6 wherein said substrate is a glass ceramic.

11. The method of claim 6 including the additional steps of
   (A) forming over the substrate of Step E of claim 6 a second lift-off mask having a pattern of openings defining at least one point of interconnection to said first metallization pattern;
   (B) sequentially depositing over the surface of said substrate inclusive of said second mask, a second combination of films of an aluminum based metal, hafnium, and magnesium oxide,
   (C) removing said mask with the overlying layers of said second combination of films thereon,
   (D) sputter depositing a second layer of a dielectric over said substrate, and
   (E) selectively etching said magnesium oxide for removal thereof together with overlying portions of dielectric thereon.

12. The method of claim 11 including the additional steps of
   (A) forming over the substrate of Step E of claim 11 a third lift-off mask having a pattern of openings defining a second conductive pattern including portions thereof over said points of interconnection,
   (B) sequentially depositing over said substrate, inclusive of said third mask films of an aluminum based metal, hafnium, and magnesium oxide,
   (C) removing said mask with overlying film portions thereon,
   (D) sputter depositing a third layer of a dielectric over said substrate, and
   (E) selectively etching said magnesium oxide for removal thereof together with overlying portions of dielectric thereon.

13. The method of claim 12 including the sequential repetition of the steps of claims 11 and 12 until the desired level of metallization is obtained.

14. A method for formation of planar dielectric coatings over a surface of a substrate comprising:
   (A) depositing a first film of an aluminum based metal over said surface;
   (B) forming over said first film a lift-off mask having a pattern of openings defining a corresponding metallization pattern of said first film,
   (C) sequentially depositing over said surface inclusive of said mask, films of hafnium, to form a part of said metallization pattern, and magnesium oxide,
   (D) removing said mask with the overlying portions of said hafnium and magnesium oxide films,
   (E) dry etching the exposed portions of said first metal film to removal thereof,
   (F) depositing a layer of a dielectric over said substrate, and
   (G) selectively etching said magnesium oxide for removal thereof together with overlying portions of the dielectric thereon.

15. The method of claim 14 wherein said substrate surface comprises a coating on a semiconductor device having at least one integrated circuit therein.

16. The method of claim 15 wherein said coating has at least one via opening for interconnection of an element of said device to said pattern.

17. The method of claim 14 wherein said substrate comprises a ceramic.

18. The method of claim 14 wherein said substrate is a glass ceramic.

19. The method of claim 14 including the additional steps of
   (A) depositing a second film of an aluminum based metal over the substrate of Step G of claim 14,
   (B) forming over said first film a second lift-off mask having a pattern of opening defining at least one point of interconnection to said metallization pattern,
   (C) sequentially depositing over said substrate, inclusive of said second mask, a second combination of films of hafnium and magnesium oxide,
   (D) removing said mask with overlying portion of the hafnium and magnesium oxide films thereon,
   (E) dry etching the exposed portions of said second aluminum film to removal thereof,
   (F) depositing a layer of a dielectric over said substrate, and
   (G) selectively etching said magnesium oxide for removal thereof together with overlying portions of dielectric thereon.

20. The method of claim 19 including the additional steps of
   (A) depositing a third film of an aluminum based metal over the substrate of Step G, in claim 19,
   (B) forming over said third metal film a third lift-off mask having a pattern of openings defining a second conductive pattern including portions thereof over said points of interconnection,
   (C) sequentially depositing over said substrate inclusive of said third mask and exposed portion of said third metal film, films of hafnium and magnesium oxide,
   (D) removing said third mask with overlying film portions,
   (E) dry etching the exposed portions of said third metal film to removal thereof,
   (F) depositing a layer of a dielectric over said substrate, and
   (G) selectively etching said magnesium oxide to removal thereof together with overlying dielectric portions.

21. The method of claim 20 including the sequential repetition of the steps of claims 19 and 20 until the desired levels of metallization are obtained.

22. A method for deposition of a dielectric coating over a surface of a substrate comprising:
   (A) sequentially depositing a first film of an aluminum based metal and a second metal film of hafnium over said surface,
   (B) forming over said second metal film a lift-off mask having a pattern of openings defining a desired corresponding metallization pattern of said first and second films,
   (C) depositing over said substrate, inclusive of said mask and the exposed portions of said second film, a layer of magnesium oxide,
   (D) removing said mask and portions of said oxide layer thereon,
   (E) sequentially dry etching the exposed portions of said second and first films to removal thereof,
   (F) depositing a layer of a dielectric over said substrate, and
   (G) selectively etching said oxide for removal thereof together with overlying portions of the dielectric thereon.

23. The method of claim 22 wherein said substrate surface comprises a coating on a semiconductor device having at least one integrated circuit therein.

24. The method of claim 22 wherein said substrate comprises a ceramic.

25. The method of claim 22 wherein said substrate is a glass ceramic.

26. The method of claim 22 including the additional steps of
   (A) sequentially depositing a third film of an aluminum based metal and a fourth film of hafnium over the substrate of Step G of claim 22,
   (B) forming over said fourth film a second lift-off mask having a pattern of openings defining at least one point of interconnection to said metallization pattern,
   (C) depositing over said mask and exposed portions of said fourth film, a layer of magnesium oxide,
   (D) removing said mask and portions of said oxide thereon,
   (E) sequentially dry etching the exposed portions of said fourth and third films to removal thereof,
   (F) depositing a layer of a dielectric over said substrate inclusive of said oxide, and
   (G) selectively etching said oxide to removal thereof together with overlying portions of the dielectric thereon.

27. The method of claim 26 including the additional steps of
   (A) sequentially depositing a fifth film of an aluminum based metal and a sixth film of hafnium over the substrate of Step G in claim 26,
   (B) forming over said sixth film a third lift-off mask having a pattern of openings defining a second conductive pattern including portions thereof over said points of interconnection,
   (C) depositing over said mask and exposed metal portions, a layer of magnesium oxide,
   (D) removing said third mask together with portions of said oxide thereon,
   (E) sequentially dry etching the exposed metal portions to removal thereof,
   (F) depositing a layer of a dielectric over said substrate inclusive of said oxide, and
   (G) selectively etching said oxide to removal thereof together with overlying portions of the dielectric thereof.

28. The method of claim 27 including the sequential repetition of the steps of claim 26 and 27 until the desired levels of metallization are obtained.

29. A process for selective removal of material from an aluminum based metal lamina of a substrate, comprising
   coating said lamina with a film of hafnium,
   forming a superimposed mask of magnesium oxide on said film exposing discrete areas thereof,
   sequential etching exposed portions of said film and said lamina, and
   removing said mask with an etchant thereof.

30. The process of claim 29 including the step of depositing an insulator on said substrate after the etching step and prior to removal of said mask.

31. In a process for fabrication of semiconductor devices comprised of an aluminum based layer on an insulating layer over a semiconductor substrate containing at least one integrated circuit therein, the steps comprising
   depositing a layer of hafnium over said aluminum based layer,
   defining a desired metallization pattern to be formed in said hafnium and aluminum based layers by a mask of magnesium oxide, dry etching exposed portions of said hafnium and aluminum based metal layers to said insulating layer, and removing said mask with an etchant.

32. The process of claim 31 including the step of depositing an insulating layer over said substrate after said etching step and before removal of said mask.

* * * * *